(12) United States Patent 
Giry-Cassan et al.

(10) Patent No.: US 12,603,609 B2 
(45) Date of Patent: Apr. 14, 2026

(54) QUADRATURE OSCILLATOR

(71) Applicant: STMicroelectronics International N.V., Geneva (CH)

(72) Inventors: Florence Giry-Cassan, Corenc (FR); Antoine Ranieri, Montbonnot-Saint-Martin (FR)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 0 days.

(21) Appl. No.: 18/656,370

(22) Filed: May 6, 2024

(65) Prior Publication Data

US 2024/0388251 A1 Nov. 21, 2024

(30) Foreign Application Priority Data

May 15, 2023 (FR) ...................................... 2304792

(51) Int. Cl. 
*H03B 5/12* (2006.01)

(52) U.S. Cl. 
CPC ......... *H03B 5/1228* (2013.01); *H03B 5/1212* (2013.01); *H03B 2200/0078* (2013.01)

(58) Field of Classification Search 
CPC .................................................. H03B 5/1228 
USPC .......................................................... 331/46 
See application file for complete search history.

(56) References Cited

U.S. PATENT DOCUMENTS 7,421,052 B2 9/2008 Li 
2006/0091969 A1 5/2006 Kenney, Jr. et al. 
2009/0146752 A1* 6/2009 O'Day ...................... H03L 1/02 
331/177 V

FOREIGN PATENT DOCUMENTS

CN 114978042 B 3/2023

OTHER PUBLICATIONS

Chamas, I et al., "A Comprehensive Analysis of Quadrature Signal Synthesis in Cross-Coupled RF VCOs," IEEE Transactions on Cirucits and Systems-I: Regular Papers, vol. 54, No. 4, Apr. 2007, 16 pages. 
Ahmadreza Rofougaran et al., "A 900 MHz CMOS LC-Oscillator with Quadrature Outputs", IEEE International Solid-State Circuits Conference, Digest of TEchnical Papers, https://ieeexplore.IEEE.org/document/488731, 2 Pages, Feb. 10, 1996, San Francisco, CA, USA.

* cited by examiner

*Primary Examiner* — Joseph Chang 
(74) *Attorney, Agent, or Firm* — Slater Matsil, LLP

(57) ABSTRACT 
The present description concerns a device comprising two oscillators coupled to each other so as to operate in quadrature, each oscillator comprising an inductor and a capacitive element having a value selectable from among at least two values, each corresponding to an operating frequency value of the oscillators, each oscillator being configured so that, for each operating frequency value of the oscillators, the quality factor of its inductor is lower than the quality factor of its capacitive element.

20 Claims, 2 Drawing Sheets

QUADRATURE OSCILLATOR

CROSS-REFERENCE TO RELATED APPLICATIONS

This application claims the priority benefit of French patent application No 23/04792 filed on May 15, 2023, entitled "Oscillateurs en quadrature," which is hereby incorporated by reference to the maximum extent allowable by law.

TECHNICAL FIELD

The present disclosure generally concerns electronic circuits, for example integrated electronic circuits, and, more particularly, in these electronic circuits, devices for generating two periodic radio frequency signals in quadrature with respect to each other.

BACKGROUND

Many known electronic circuits, for example wireless transmitters and/or receivers, comprise known devices for generating periodic signals in quadrature with respect to each other.

Some of these known devices use a polyphase filter to generate the two signals in quadrature.

Other known devices use an oscillator delivering a first periodic signal based on which are generated the two quadrature signals by a frequency division, the first signal then having to have a frequency twice higher than that targeted for the two quadrature signals.

Still other known devices use two oscillators interconnected to each other to deliver the two quadrature signals, the two interconnected oscillators being said to be in quadrature. An example of such a device with quadrature oscillators is for example described in relation with drawing number 1(b) of the article "A 900 MHz CMOS LC-Oscillator with Quadrature Outputs" by A. Rofougaran et. al., published in 1996 in ISSCC, which is hereby incorporated by reference to the maximum extent allowable by law.

However, the above-described known devices have disadvantages. For example, these known devices do not enable to obtain quadrature signals having a frequency selectable (or settable) from among a plurality of high values, for example higher than 5 GHz, extending over a wide frequency range, for example a frequency range from 5 to 10 GHz. For example, these known devices are not adapted to an implementation in an ultra wide band (UWB) radio frequency transmit and/or receive circuit.

SUMMARY

There exists a need to overcome all or part of the disadvantages of known devices for generating two quadrature signals.

For example, there exists a need for a device enabling to generate two quadrature signals with a frequency having a value greater than 5 GHz and selectable over a wide frequency range, for example from 5 GHz to 10 GHz.

Embodiments of the disclosure overcome all or part of the disadvantages of known devices for generating two quadrature signals.

In accordance with an embodiment, a device comprises two oscillators coupled to each other so as to operate in quadrature, each oscillator comprising an inductor and a capacitive element having a value selectable from among at least two values, each corresponding to an operating frequency value of the oscillators, each oscillator being configured so that, for each operating frequency value of the oscillators, the quality factor of its inductor is lower than the quality factor of its capacitive element.

According to an embodiment, in each oscillator:
the inductor comprises first and second identical windings;
the first winding has a first end coupled to a first node of application of a power supply potential and a second end coupled to a second output node of the oscillator;
the second winding has a first end coupled to the first node and a second end coupled to a third output node of the oscillator; and
a first electrode of the capacitive element is connected to the second node and a second electrode of the capacitive element is connected to the third node.

According to an embodiment, in each oscillator, the inductor comprises a first resistor series-connected to the first winding between the first and second nodes, and a second resistor series-connected to the second winding between the first and third nodes, the first and second resistors having a same resistance value.

According to an embodiment, each of the first and second resistors has a resistance value in the range from 0.5 to 5 ohms, the at least two values of the capacitance of the capacitive element being for example in the range from 0.5 to 2.0 pF and the inductance of the inductor for example having a value in the range from 300 to 700 pH.

According to an embodiment, in each oscillator, each of the first and second resistors is implemented by at least one polysilicon portion, which may be non-doped.

According to an embodiment, each of the first and second resistors comprises:
a first conductive portion of a first metal level of an interconnection structure, the first conductive portion corresponding to a first terminal of the resistor;
a second conductive portion of the first metal level corresponding to a second terminal of the resistor;
at least one third conductive portion of a second metal level of the interconnection structure;
at least one fourth conductive portion of the second metal level;
first conductive vias electrically coupling the first portion to the at least one third portion and the second portion to the at least one fourth portion; and
second conductive vias electrically coupling the at least one polysilicon portion to the at least one third portion and to the at least one fourth portion.

According to an embodiment, in each of the oscillators, the capacitive element comprises a plurality of capacitive elements associated with switches configured so that each of the at least two values corresponds to a given combination of off and on states of the switches.

According to an embodiment, in each of the oscillators, the capacitive element with a selectable value further comprises varicap diodes.

According to an embodiment, each of the oscillators further comprises: a first MOS transistor and a second MOS transistor, each having a first conduction terminal connected to the second node and a second conduction terminal coupled to a fifth node of application of a reference potential, the first transistor having its gate coupled to the third node; a third MOS transistor and a fourth MOS transistor, each having a first conduction terminal connected to the third node and a second conduction terminal coupled to the fifth node, the third transistor having its gate coupled to the second node.

According to an embodiment:

the second transistor of a first one of the two oscillators has its gate coupled to the second node of a second one of the two oscillators;

the fourth transistor of the first oscillator has its gate coupled to the third node of the second oscillator;

the second transistor of the second oscillator has its gate coupled to the third node of the first oscillator; and the fourth transistor of the second oscillator has its gate coupled to the second node of the first oscillator.

According to an embodiment, each of the oscillators comprises:

a first current source having a first terminal connected to the second conduction terminals of the first and third transistors of the oscillator, and a second terminal connected to the fifth node; and a second current source having a first terminal connected to the second conduction terminals of the second and fourth transistors of the oscillator, and a second terminal connected to the fifth node.

According to an embodiment, each operating frequency value belongs to a range from 5 GHz to 10 GHz.

According to an embodiment, the operating frequency values comprise a first value in the range from 5 to 6.5 GHz and a second value in the range from 8.5 to 10 GHz.

According to an embodiment, each of the operating frequency values is separated from the other operating frequency values by at least 0.5 GHz.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF ILLUSTRATIVE EMBODIMENTS

Figure 1:
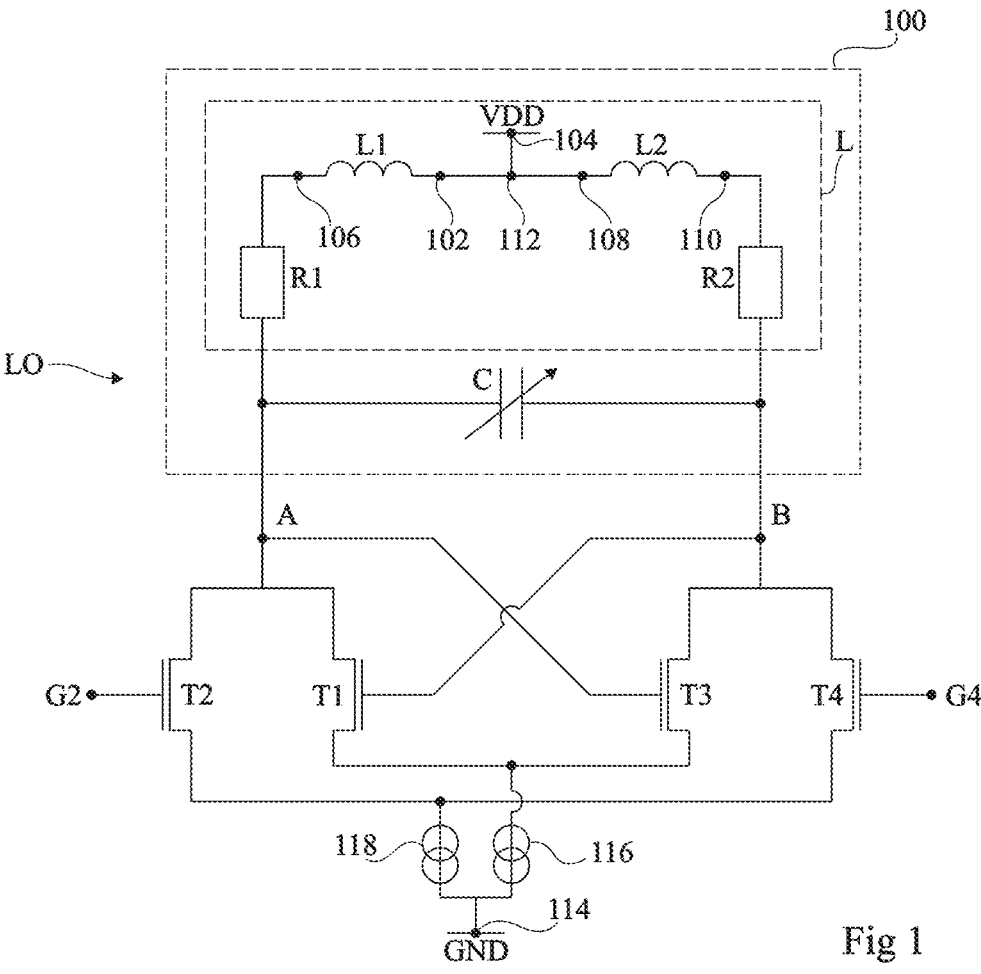
FIG. 1 illustrates an embodiment of an oscillator.

Like features have been designated by like references in the various figures. In particular, the structural and/or functional features that are common among the various embodiments may have the same references and may dispose identical structural, dimensional and material properties.

For the sake of clarity, only the steps and elements that are useful for the understanding of the described embodiments have been illustrated and described in detail. In particular, usual electronic circuits, for example integrated, and usual applications where there may be provided a device for generating two quadrature signals, have not been described in detail, the described embodiments being compatible with these usual circuits and applications.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "edge", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings.

Unless specified otherwise, the value of a parameter is said to be selectable from among a plurality of values when the value of the parameter is controllable and can take each of the plurality of values according to its control. For example, the value of a capacitive element is said to be selectable from among a plurality of values when the capacitance can take each of this plurality of values, for example under control of one or a plurality of control signals. As another example, the value of an operating frequency is said to be selectable from among a plurality of values when the frequency can take each of this plurality of values, for example under control of one or a plurality of control signals.

Unless specified otherwise, the expressions "about", "approximately", "substantially", and "in the order of" signify plus or minus 10%, or plus or minus 5%.

Among the previously disclosed known devices, quadrature oscillators enable the generation of quadrature signals having frequencies greater than one GHz, for example a frequency in the order of 5 GHz. However, quadrature oscillators may switch between two operating modes respectively corresponding to two different frequency values for the quadrature signals generated by the device. More particularly, in a first one of the two operating modes, the operating frequency of the quadrature oscillators is higher than the operating frequency of these oscillators not interconnected to each other, and, in a second one of the two operating modes, the operating frequency of the quadrature oscillators is lower than the operating frequency of these oscillators not interconnected to each other. Forcing the oscillators of the device to operate in one of the two modes only enables to ensure for the frequency of the quadrature signals to be effectively that desired. For this purpose, it has been proposed to add phase shifters in the connections between the two quadrature oscillators. However, in a device with quadrature oscillators interconnected to each other via phase shifters, the phase shifters are sized for a given operating frequency, that is, a given frequency of the quadrature signals delivered by the device. As a result, the switching between the two operating modes is not controlled over the entire operating range of the device, which raises an issue. For example, such a device may not be adapted to generating quadrature signals having a frequency with a value selectable from among a plurality of values in a range from 5 GHz to 10 GHz, for example a frequency having a value selectable from among at least a first frequency value in the range from 5 to 6.5 GHz and a second frequency value in the range from 8.5 to 10 GHz and/or a frequency having a value selectable from among a plurality of values separated from one another by at least 0.5 GHz.

Embodiments of the disclosure include a device comprising two quadrature oscillators, that is, two oscillators coupled to each other so as to operate in quadrature, where each oscillator comprises an LC-type tank in parallel and is configured so that, for each selectable operating frequency value of the oscillators of the device, the quality factor of the inductor L of the LC tank is lower than the quality factor of the capacitive element C of the LC tank. In practice, in such a device, each LC tank comprises a capacitive element having a value selectable (or controllable) from among a plurality of values, each of these selectable capacitance values corresponding to a different operating frequency of the device.

The provision of an inductor L with a quality factor lower than that of capacitive element C results in more significant losses as compared with the case where inductor L would have a higher quality factor, for example higher than that of capacitive element C. This goes against usual practice which consists, in the LC tank of an oscillator, of having an inductor L having a quality factor which is as a high as possible and thus generally higher than that of the capacitive element C of the LC tank. Indeed, an LC load having an inductor L having a quality factor which is the highest possible, and, in particular, higher than that of the capacitive element C of the tank, enables reduction of power consumption and improvement of (for example, a decrease of) the phase noise.

However, the provision, for each selectable operating frequency value of the embodiment device, of an inductor L with a quality factor lower than that of the capacitive element enables, for each of these operating frequency values, the embodiment device to always be in the same operating mode among the two operating modes between which quadrature oscillators can switch.

To ensure that, for each selectable operating frequency value of the device, the embodiment device is always in the same operating mode among the two operating modes between which quadrature oscillators can switch, it could have been devised to configure the LC tank so that, for each selectable operating frequency value, the quality factor of the inductor L of the LC tank is higher than the quality factor of the capacitive element C of the LC tank. However, the embodiment device would then be held in the operating mode where the frequency of the quadrature signals that it delivers is lower than the operating frequency of each of the oscillators not interconnected to each other. Conversely, when for each selectable operating frequency value of the embodiment device, the quality factor of the inductor L of the LC tank is lower than the quality factor of the capacitive element C of the LC tank, the embodiment device is held in the operating mode where the frequency of the quadrature signals that it delivers is higher than the operating frequency of the oscillators not interconnected to each other, which is advantageous when operating frequencies greater than 5 GHz comprising for example an operating frequency in the range from 8.5 to 10 GHz are targeted.

According to an embodiment, to ensure that for each selectable operating frequency value, the quality factor of inductor L is lower than that of capacitive element C, the inductor L of each oscillator comprises at least one resistor, despite the fact that this resistor increases losses in the inductor. As an example, this resistor is configured to limit the increase of the power consumption, of the phase noise, and of the capacitances resulting from the introduction of this resistor, while ensuring that, for each of the selectable operating frequency values of the device, the embodiment device is held in the same operating mode, that is, that where the quality factor of the inductor is lower than that of the capacitive element. In some embodiments, the resistance value is selected to be the lowest possible among the resistance values enabling to ensure the above operation.

According to an embodiment, the at least one resistor of inductor L is implemented by an intrinsic (that is, not intentionally doped) polysilicon portion, rather than by a conductive portion of a metal level of an interconnection structure of the integrated circuit of the device. Indeed, polysilicon does not suffer from the electromigration problems of a metal layer portion of a metal level.

Embodiments and variants of such a device will now be described.

In the rest of the description, as an example, the described embodiment device is configured to have an operating frequency having a value selectable from among at least two values belonging to a frequency range from 5 GHz to 10 GHz, for example from among at least two values comprising a first value in the range from 5 to 6.5 GHz and a second value in the range from 8.5 to 10 GHz. In some embodiments, each of the selectable frequency values is separated from the other selectable frequency values by at least 0.5 GHz. However, those skilled in the art are capable, based on the functional indications given in the present description, of modifying the frequency range to which the selectable frequency values and/or the selectable frequency values belong. For example, those skilled in the art are capable, based on the present description, to adapt the selectable values of capacitance C so that all or part of the operating frequencies of the oscillators of the device are lower than 5 GHz. Indeed, the device described herein is configured to deliver quadrature signals at frequencies lower than 5 GHz although it is, for example, more particularly advantageous for operating frequencies higher than 5 GHz.

Figure 2:
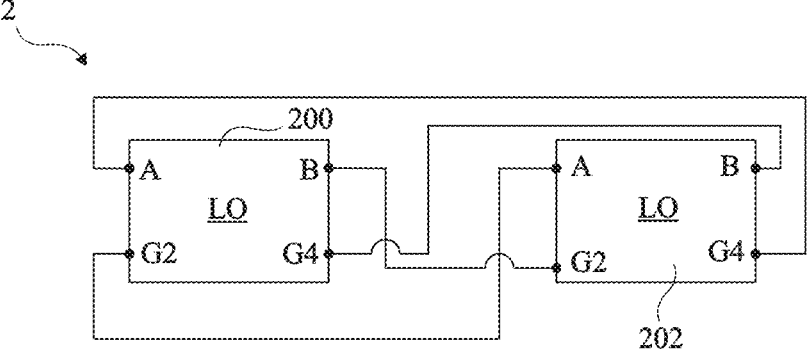
FIG. 2 illustrates in the form of blocks an embodiment of a device comprising two quadrature oscillators identical to that of FIG. 1.

FIG. 1 illustrates an embodiment of an LO oscillator, and FIG. 2 illustrates, in the form of blocks, an embodiment of a device 2 comprising two LO oscillators in quadrature, that is, interconnected to each other so as to operate in quadrature or, in other words, so as to deliver two quadrature signals.

As illustrated in FIG. 1, the LO oscillator comprises a tank 100 of parallel LC type. Tank 100 comprises a capacitive element C and an inductor L. Capacitive element C has a value selectable (controllable) from among at least two values, each corresponding to an operating frequency of the LO oscillators of device 2.

In device 2, the two quadrature LO oscillators, respectively bearing references 200 and 202 in FIG. 2, are each configured so that, for each operating frequency of the LO oscillators of device 2, the quality factor of the inductor L of the oscillator is lower than that of its capacitive element C.

According to an embodiment, to obtain this relation between the quality factors of inductor L and of the controllable capacitive element C of the LO oscillator, capacitive element C is optimized so that its quality factor is as high as possible, and inductor L is selected with a low quality factor which is lower than that of capacitive element C.

According to an embodiment, inductor L comprises at least one resistor. This enables to decrease the quality factor of inductor L with respect to the case where the resistor is omitted, so that the quality factor of inductor L is lower than that of capacitive element C.

In each LO oscillator, tank 100 is connected between two output nodes A and B of LO oscillator. For example, inductor L is connected between the two nodes A and B and capacitive element C is connected between the two nodes A and B, in parallel with inductor L. More particularly, capacitive element C has an electrode connected to node A and an electrode connected to node B.

Although this is not illustrated in FIG. 1, capacitive element C comprises, according to an embodiment, a bank of selectable capacitive elements, that is, a plurality of capacitive elements and a plurality of switches associated with these capacitive elements and configured so that each selectable value of capacitive element C corresponds to a given combination of the off and on states of these switches. In this case, the control signals of the switches are signals for controlling capacitive element C.

According to an embodiment, capacitive element C further comprises varicap diodes (varactors), a varicap diode being a diode behaving as a capacitive element having its value varying with the reverse voltage applied thereacross. In such an embodiment, the bank of capacitive elements allows a rough setting of the value of capacitive element C and the varicap diodes allow a fine setting of the value of capacitive element C. In this case, the signal(s) enabling to select or control the value of the reverse voltage applied across each varicap diode are, in addition to the signals for controlling the switches of the bank of capacitive elements, signals for controlling capacitive element C.

The implementation of capacitive element C is within the abilities of those skilled in the art based on the functional indications given in the present description.

According to an embodiment, the inductor L of each LO oscillator comprises a first winding L1 and a second winding L2 identical to winding L1. The windings are series-connected between nodes A and B of the LO oscillator. More particularly, winding L1 has an end 102 coupled, or in some embodiments connected, to a node 112, itself coupled to a node 104 configured to receive a power supply potential VDD, and an end 106 coupled to node A, winding L2 having an end 108 coupled, or in some embodiments connected, to node 112 and an end 110 coupled to node B. In the example of FIG. 1, the ends 102 and 108 of respective windings L1 and L2 are connected to node 112. Further, in the example of FIG. 1, node 112 is connected to node 104.

In the example of FIG. 1, potential VDD is positive and referenced with respect to a reference potential GND, for example the ground.

In an embodiment not illustrated, inductor L comprises no resistor and only comprises windings, for example windings L1 and L2. In such an embodiment, inductor L and capacitive element C however remain configured so that, for each of the operating frequencies of device 2, the quality factor of inductor L is lower than that of capacitive element C.

However, according to the number and/or to the values of the operating frequencies of device 2, it is difficult, or even impossible, to have an inductor L having a quality factor lower than that of the capacitive element for each operating frequency of device 2.

Thus, according to another embodiment, as previously indicated, inductor L comprises at least one resistor so as to decrease its quality factor. More particularly, as illustrated in FIG. 1, inductor L comprises a resistor R1 series-connected to winding L1 between nodes 112 and A, and a resistor R2 series-connected to winding L2 between nodes 112 and B. Resistors R1 and R2 have a same resistance value, for example in the range from 0.5 to 5 ohms. As an example, as illustrated in FIG. 1, resistor R1 is connected between end 106 of winding L1 and node A, resistor R2 being connected between end 110 of winding L2 and node B.

According to an embodiment, each resistor R1, R2 is implemented by at least a portion of non-doped, that is, not intentionally doped, polysilicon. For example, in each resistor R1, R2, each polysilicon portion of the resistor rests on a semiconductor substrate. As an example, an insulating layer is arranged between the polysilicon and the substrate to separate the polysilicon of the resistor from the semiconductor of the substrate, although in other examples this insulating layer may be omitted. For example, in each resistor R1, R2, each polysilicon portion of the resistor has an end (or a side) electrically coupled to a same portion of conductive layer of a metal level of an interconnection structure resting on the substrate, this conductive portion corresponding, for example, to a first terminal of the resistor, and a second end electrically coupled to a same other conductive layer portion of this metal level, this other conductive portion corresponding, for example, to a second terminal of the resistor.

In alternative embodiments, resistors R1 and R2 may each be implemented by a portion of metal conductive layer of a metal level of an interconnection structure. However, this portion of metal conductive layer will be subject to electro-migration phenomena, which is not the case for polysilicon.

Each LO oscillator further comprises transistors T1, T2, T3, and T4. Transistors T1 to T4 are MOS ("Metal Oxide Semiconductor") transistors.

Transistors T1 and T2 each have a first conduction terminal coupled, or in some embodiments connected, to node A, and a second conduction terminal coupled to a node 114 configured to receive reference potential GND. Transistors T3 and T4 each have a first conduction terminal coupled, or in some embodiments connected, to node B, and a second conduction terminal coupled to node 114. The first conduction terminal of each transistor T1, T2, T3, T4 corresponds, for example, to the drain of this transistor, its second conduction terminal then corresponding to its source.

Transistor T1 has its gate coupled, for example connected, to node B, transistor T3 having its gate coupled, for example connected, au node A.

In the rest of the disclosure, in each LO oscillator, the gate of transistor T2 bears reference G2 and the gate of transistor T4 bears reference G4. In each LO oscillator, nodes A and B are for example outputs of the oscillator, and terminals G2 and G4 are inputs of the oscillator.

The interconnection of two quadrature oscillators is, for example, illustrated by the drawing number 1(d) of the article "A 900 MHz CMOS LC-Oscillator with Quadrature Outputs", and applies to the two oscillators 200 and 202 of device 2.

More particularly, as seen in FIG. 2 where LO oscillators 200 and 202 are each represented by a block comprising two outputs A and B and two inputs G2 and G4, in device 2:

input G2 of oscillator 200 is coupled, for example connected, to output A of oscillator 202;

input G4 of oscillator 200 is coupled, for example connected, to output B of oscillator 202;

input G2 of oscillator 202 is coupled, for example connected, to output B of oscillator 200; and input G4 of oscillator 202 is coupled, for example connected, to output A of oscillator 200.

In the example of FIG. 1 where potential VDD is positive with respect to potential GND, transistors T1 to T4 are N-channel MOS or NMOS transistors. In another example not illustrated where potential VDD is negative with respect to potential GND, transistors T1 to T4 are P-channel MOS, or PMOS, transistors.

As an example, transistors T1 and T3 are identical to each other, and transistors T2 and T4 are identical to each other.

In examples, all transistors T1 to T4 are identical, that is, they have the same dimensions.

In other examples, the ratio of the dimensions of identical transistors T1 and T3 to those of identical transistors T2 and T4 is determined by a target coupling coefficient between the two oscillators 200 and 202.

According to an embodiment, node 112 is connected to node 104, the ends 102 and 108 of respective windings L1 and L2 then being, for example, connected to node 104. Further, the second conduction terminals of transistors T1 to T4 are coupled to node 114 by at least one current source. As an example, in such an embodiment, in each LO oscillator, the gate of transistor T1 is connected to node B of the oscillator, the gate of transistor T3 being connected to node A of the oscillator. Still as an example, in such an embodiment, input G2 of oscillator 200 is connected to output A of oscillator 202, input G4 of oscillator 200 is connected to output B of oscillator 202, input G2 of oscillator 202 is connected to output B of oscillator 200, and input G4 of oscillator 202 is connected to output A of oscillator 200.

As an example, in an embodiment where the second conduction terminals of transistors T1 to T4 are coupled to node 114 by at least one current source, as illustrated in FIG. 1, in each LO oscillator, a current source 116 is connected between the second conduction terminals of transistors T1 and T3 and node 114, and another current source 118 is connected between the second conduction terminals of transistors T2 and T4 and node 114. Current source 116 has, for example, a terminal connected to two second conduction terminals of transistors T1 and T3 and another terminal connected to node 114, current source 116 having, for example, a terminal connected to two second conduction terminals of transistors T2 and T4 and another terminal connected to node 114.

The provision of two current sources 116 and 118 to bias the transistors, respectively T1 and T3, and T2 and T4, enables for parameter gm of transistors T1 and T3 to be different from parameter gm of transistors T2 and T4.

As an alternative example not illustrated, in an embodiment where the second conduction terminals of transistors T1 to T4 are coupled to node 114 by at least one current source, in each LO oscillator, a single current source is connected between the second conduction terminals of transistors T1 to T4 and node 114, this current source having, for example, a terminal connected to the second conduction terminal of each of transistors T1 to T4 and another conduction terminal connected to node 114.

In an alternative embodiment not illustrated, the second conduction terminals of transistors T1 to T4 are all connected to node 114 and node 112 is coupled to node 104 by a current source, the current source having, for example, a terminal connected to node 112 and a terminal connected to node 104. As an example, in such an alternative embodiment, in each LO oscillator, the gate of transistor T1 is connected to node B of the oscillator, the gate of transistor T3 being connected to node A of the oscillator. Still as an example, in such an alternative embodiment, input G2 of oscillator 200 is connected to output A of oscillator 202, input G4 of oscillator 200 is connected to output B of oscillator 202, input G2 of oscillator 202 is connected to output B of oscillator 200, and input G4 of oscillator 202 is connected to output A of oscillator 200.

In another alternative embodiment not illustrated, the second conduction terminals of transistors T1 to T4 are all connected to node 114, and node 112 is connected to node 104. As an example, in such an alternative embodiment, in each LO oscillator, the gate of transistor T1 is coupled to node B of the oscillator by a capacitive element, the gate of transistor T3 is coupled to node A of the oscillator by a capacitive element, input G2 of oscillator 200 is coupled to output A of oscillator 202 by a capacitive element, input G4 of oscillator 200 is coupled to output B of oscillator 202 by a capacitive element, input G2 of oscillator 202 is coupled to output B of oscillator 200 by a capacitive element, and input G4 of oscillator 202 is coupled to output A of oscillator 200 by a capacitive element.

The above-described device 2 enables the obtaining of a first periodic signal on output B of oscillator 200, a second periodic signal on output A of oscillator 200, the second signal having the same frequency as the first signal but being phase-shifted by 180° with respect to the first signal, a third periodic signal on output B of oscillator 202, the third signal having the same frequency as the first signal but being phase-shifted by 90° with respect to the first signal, and a fourth periodic signal on output A of oscillator 202, the fourth signal having the same frequency as the first signal but being phase-shifted by 270° with respect to the first signal. Thus, the signals of outputs A and B of oscillator 202 are in quadrature with the signals of the respective outputs A and B of oscillator 200.

As an example, the device 2 of FIG. 2 enables the obtaining of generate two periodic signals in quadrature at a frequency selectable from among five frequency values respectively equal to 6.4896 GHZ; 7.1136 GHZ; 7.7376 GHz; 8.3616 GHz and 8.9856 GHz, while holding the oscillators in the same operating mode for each of these values, which was not possible with known devices with quadrature oscillators.

Taking the above example again, the value of resistors R1 and R2 is, for example, in the range from 0.5 to 5 ohms, the value of the inductance of the inductor L, that is, of the assembly of the two windings L1 and L2, is, for example, in the range from 300 to 700 pH (picohenries), and each of the values that capacitance C can take is, for example, in the range from 0.5 to 2 pF (picofarads).

Those skilled in the art will be capable, based on the functional description made hereabove, of providing other operating frequency values, and of accordingly adapting the values of inductor L and variable capacitance C.

Figure 3:
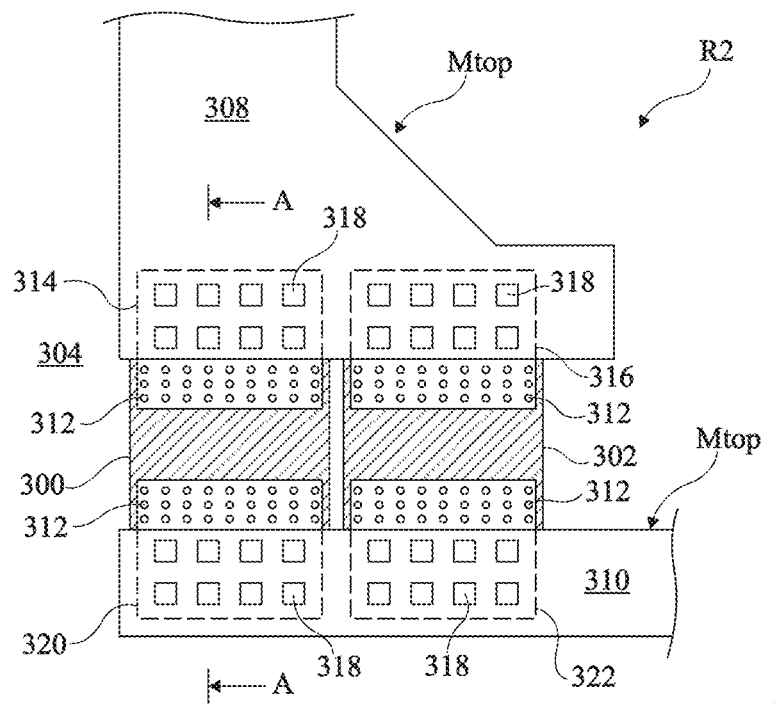
FIG. 3 illustrates, in a simplified top view, an example of an embodiment of a resistor of the oscillators of FIGS. 1 and 2.
Figure 4:
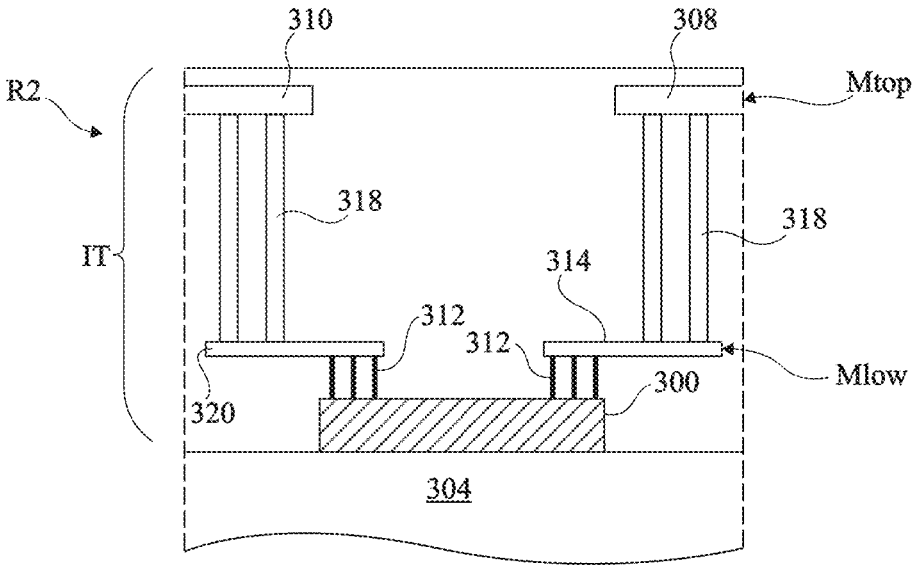
FIG. 4 illustrates a simplified cross-section view of the resistor of FIG. 3.

FIG. 3 illustrates, in a simplified top view, an example of an embodiment of the resistors R1 and R2 of the oscillators of FIGS. 1 and 2, FIG. 4 being a cross-section view taken along plane AA of FIG. 3. In FIGS. 3 and 4, only resistor R2 is illustrated, it being understood that resistor R1 is identical or similar to resistor R2. In this embodiment, resistor R2 is implemented by at least one non-doped polysilicon portion.

For example, in FIGS. 3 and 4, resistor R2 is implemented by two polysilicon portions 300 and 302. The provision of two polysilicon portions 300 and 302 rather than a single one may for example result from integrated circuit design constraints in a given manufacturing technology. However, each resistor R1, R2 may also be implemented by a single polysilicon portion or by more than two polysilicon portions.

Each polysilicon portion 300, 302 of resistor R2 rests on a semiconductor substrate 304, for example made of single-crystal silicon.

In the illustrated example, the polysilicon of portions 300 and 302 directly rests on substrate 304.

However, in other examples not illustrated, each portion 300, 302 is separated from substrate 304 by an insulating layer arranged between the polysilicon and the substrate. As an example, in this case, the insulating layer has a first surface in contact with substrate 304 and a second surface in contact with the polysilicon, the second surface being opposite to the first surface.

Each portion 300, 302 has an end or a side (at the top in FIG. 3 and on the right-hand side in FIG. 4) which is electrically coupled to a same portion 308 of a conductive layer of a metal level Mtop of an interconnection structure IT resting on substrate 304. Thus, in the example of FIGS. 3 and 4 where resistor R2 comprises two polysilicon portions 300 and 302, these two portions are electrically coupled to portion 308 of metal level Mtop. Portion 308 of metal level Mtop corresponds, for example, to a first terminal of resistor R2, for example connected to end 110 of the winding L2 of inductor L (see above, FIG. 1).

Symmetrically, each portion 300, 302 has another end or another side (at the bottom in FIG. 3 and on the left-hand side in FIG. 4) which is electrically coupled to a same portion 310 of a conductive layer of metal level Mtop. Thus, in the example of FIGS. 3 and 4 where resistor R2 comprises two polysilicon portions 300 and 302, these two portions are electrically coupled to portion 310 of metal level Mtop. Portion 310 of metal level Mtop corresponds, for example, to a second terminal of resistor R2, for example connected to node B (FIG. 1).

As an example, each portion 300, 302 is electrically coupled to portion 308, respectively 310, of metal level Mtop via conductive vias and, for example, one or a plurality of portions of conductive layers of one or a plurality of metal levels of structure IT which are arranged between the polysilicon and metal level Mtop.

In some embodiments, level Mtop corresponds to the least resistive metal level of structure IT, that is, for example, to the metal level which is most distant from the substrate.

In the example of FIGS. 3 and 4, one end of each of the portions 300 and 302 (at the top in FIG. 3 and on the right-hand side in FIG. 4) is coupled by conductive vias 312 to a corresponding portion 314, 316 of a metal level Mlow of structure IT, this portion 314, 316 being coupled by conductive vias 318 to portion 308 of metal level Mtop. Metal level Mlow is arranged between substrate 304 and metal level Mtop. Further, another end of each of portions 300 and 302 (at the bottom in FIG. 3 and on the left-hand side in FIG. 4) is coupled by other conductive vias 312 to a corresponding portion 320, 322 of metal level Mlow, this portion 320, 322 being coupled by conductive vias 318 to portion 310 of metal level Mtop.

In some embodiments, metal level Mlow is the least resistive metal level of structure IT from which vias 312 may extend all the way to the polysilicon of the resistor, that is, the polysilicon of portions 300 and 302 in this example. In other words, in some embodiments, metal level Mlow is the least resistive metal level among all the metal levels of structure IT from which vias may be formed all the way to the polysilicon of the resistor.

Further, although this is not detailed in FIGS. 3 and 4, interconnection structure IT generally comprises intermediate metal levels arranged between level Mtop and level Mlow. Although this is not detailed in FIGS. 3 and 4, one or a plurality of metal levels may be provided between level Mlow and the substrate.

As an example, as illustrated in FIGS. 3 and 4, vias 312 extend from an end of portion 300 to portion 314 of metal level Mlow, other vias 312 extend from another end of portion 300 to portion 320 of metal level Mlow, still other vias 312 extend from an end of portion 302 to portion 316 of metal level Mlow, and still other vias 312 extend from another end of portion 302 to portion 322 of metal level Mlow. Further, vias 318 extend from each of the portions 314 and 316 of metal level Mlow to portion 308 of metal level Mtop, and other vias 318 extend from each of the portions 320 and 322 of metal level Mlow to portion 310 of metal level Mtop.

An advantage of providing a coupling of portions 300 and 302 with metal level Mtop by means of vias 318, metal level Mlow, and vias 312 is that the integration density of vias 312 is greater than that of vias 318, which enables the decreasing of the resistance of the electric connection between metal level Mtop and the polysilicon.

Although in the above example, polysilicon portion 300 is coupled by vias 112 to portions 314 and 320 of metal level Mlow and polysilicon portion 302 is coupled by vias 112 to portions 316 and 322 distinct from the respective portions 314 and 320, this choice is for example linked to design rules for the integrated circuit. Thus, in other examples not illustrated, portion 314 and portion 318 of metal level Mlow form one and the same portion of this metal level, and, similarly, portion 314 and portion 318 of metal level Mlow form one and the same portion of this metal level.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

What is claimed is:

1. A device comprising:
two oscillators coupled to each other, the two oscillators being configured to operate in quadrature, each oscillator comprising an inductor and a capacitor, the capacitor comprising a value selectable from among at least two values, each corresponding to an operating frequency value of the oscillators, each oscillator being configured so that, for each operating frequency value of the oscillators, the quality factor of its inductor is lower than the quality factor of its capacitor, wherein, in each oscillator, the inductor comprises:

identical first and second windings, the first winding having a first end coupled to a first node of application of a power supply potential and a second end coupled to a second output node of the oscillator, and the second winding having a first end coupled to the first node and a second end coupled to a third output node of the oscillator, a first electrode of the capacitor being connected to the second output node and a second electrode of the capacitor being connected to the third output node; and a first resistor series-connected to the first winding between the first node and the second output node and a second resistor series-connected to the second winding between the first node and the third output node, the first and second resistors having a same resistance value, each of the first and second resistors comprising:
at least one polysilicon portion;
a first conductive portion of a first metal level of an interconnection structure, the first conductive portion corresponding to a first terminal of the respective resistor;
a second conductive portion of the first metal level corresponding to a second terminal of the respective resistor;
at least one third conductive portion of a second metal level of the interconnection structure;
at least one fourth conductive portion of the second metal level;
first conductive vias electrically coupling the first conductive portion to the at least one third conductive portion and the second conductive portion to the at least one fourth conductive portion; and second conductive vias electrically coupling the at least one polysilicon portion to the at least one third conductive portion and to the at least one fourth conductive portion.

2. The device according to claim 1, wherein each of the first and second resistors has a resistance value in a range from 0.5 to 5 ohms, the capacitance of the capacitor being in a range from 0.5 to 2.0 pF, and the inductance of the inductor having a value in a range from 300 to 700 pH.

3. The device according to claim 1, wherein, in each of the oscillators, the capacitor comprises a plurality of switch capacitors coupled with switches configured so that each of the at least two values corresponds to a given combination of off and on states of the switches.

4. The device according to claim 3, wherein, in each of the oscillators, the capacitor with a selectable value further comprises varicap diodes.

5. The device according to claim 1, wherein each operating frequency value belongs to a range from 5 GHz to 10 GHz.

6. The device according to claim 1, wherein the operating frequency values comprise a first value in a range from 5 to 6.5 GHz and a second value in a range from 8.5 to 10 GHz.

7. The device according to claim 1, wherein each of the operating frequency values is separated from the other operating frequency values by at least 0.5 GHz.

8. A device comprising:
two oscillators coupled to each other, the two oscillators being configured to operate in quadrature, each oscillator comprising an inductor and a capacitor, each respective inductor comprising respective first and second windings and a respective resistor, the respective first winding having a respective first end coupled to a respective first node of application of a power supply potential and a respective second end coupled to a respective second output node of the oscillator, the respective second winding having a respective first end coupled to the respective first node and a respective second end coupled to a respective third output node of the oscillator, a respective first electrode of the respective capacitor being connected to the respective second output node and a respective second electrode of the respective capacitor being connected to the respective third output node, and each oscillator being configured so that, for each operating frequency value of the oscillators, the quality factor of its respective inductor is lower than the quality factor of its respective capacitor, the respective resistor being series-connected to the first winding between the respective first node and the respective second output node, the respective resistor comprising:
at least one polysilicon portion;
a first conductive portion of a first metal level of an interconnection structure, the first conductive portion corresponding to a first terminal of the respective resistor;
a second conductive portion of the first metal level corresponding to a second terminal of the respective resistor;
at least one third conductive portion of a second metal level of the interconnection structure;
at least one fourth conductive portion of the second metal level;
first conductive vias electrically coupling the first conductive portion to the at least one third conductive portion and the second conductive portion to the at least one fourth conductive portion; and second conductive vias electrically coupling the at least one polysilicon portion to the at least one third conductive portion and to the at least one fourth conductive portion.

9. The device according to claim 8, wherein each of the oscillators further comprises:
a first MOS transistor and a second MOS transistor each having a first conduction terminal connected to the second output node and a second conduction terminal coupled to a fifth node of application of a reference potential, the first MOS transistor having its gate coupled to the third output node; and
a third MOS transistor and a fourth MOS transistor each having a first conduction terminal connected to the third output node and a second conduction terminal coupled to the fifth node, the third MOS transistor having its gate coupled to the second output node.

10. The device according to claim 9, wherein:
the second MOS transistor of a first oscillator of the two oscillators has its gate coupled to the second output node of a second oscillator of the two oscillators;
the fourth MOS transistor of the first oscillator has its gate coupled to the third output node of the second oscillator;
the second MOS transistor of the second oscillator has its gate coupled to the third output node of the first oscillator; and
the fourth MOS transistor of the second oscillator has its gate coupled to the second output node of the first oscillator.

11. The device according to claim 9, wherein each of the oscillators comprises:
a first current source having a first terminal connected to the second conduction terminals of the first and third MOS transistors of the oscillator, and a second terminal connected to the fifth node; and
a second current source having a first terminal connected to the second conduction terminals of the second and fourth MOS transistors of the oscillator, and a second terminal connected to the fifth node.

12. A device comprising:
two oscillators coupled to each other, the two oscillators being configured to operate in quadrature, each oscillator comprising an inductor and a capacitor, each oscillator being configured so that, for each operating frequency value of the oscillators, the quality factor of its inductor is lower than the quality factor of its capacitor, the inductor comprising at least one resistor, the resistor comprising:
a portion of non-doped polysilicon on a semiconductor substrate;
a first conductive portion of a first metal level of an interconnection structure, the first conductive portion corresponding to a first terminal of the resistor;
a second conductive portion of the first metal level corresponding to a second terminal of the resistor;
at least one third conductive portion of a second metal level of the interconnection structure;
at least one fourth conductive portion of the second metal level;
first conductive vias electrically coupling the first conductive portion to the at least one third conductive portion and the second conductive portion to the at least one fourth conductive portion; and second conductive vias electrically coupling the por-
tion of non-doped polysilicon to the at least one third
conductive portion and to the at least one fourth
conductive portion.

13. The device according to claim 12, wherein, in each of
the oscillators, the capacitor further comprises varicap
diodes.

14. The device according to claim 12, wherein each
operating frequency value belongs to a range from 5 GHz to
10 GHz.

15. The device according to claim 12, wherein the oper-
ating frequency values comprise a first value in a range from
5 to 6.5 GHz and a second value in a range from 8.5 to 10
GHz.

16. The device according to claim 12, wherein each of the
operating frequency values is separated from the other
operating frequency values by at least 0.5 GHz.

17. The device according to claim 1, wherein each of the
resistors comprises two respective polysilicon portions.

18. The device according to claim 1, wherein the at least
one polysilicon portion directly rests on a semiconductor
substrate.

19. The device according to claim 1, wherein the at least
one polysilicon portion is separated from a semiconductor
substrate by an insulating layer between the at least one
polysilicon portion and the semiconductor substrate.

20. The device according to claim 1, wherein the value is
selectable from among five frequency values respectively
equal to 6.4896 GHZ; 7.1136 GHZ; 7.7376 GHz; 8.3616
GHz and 8.9856 GHz.

\* \* \* \* \*